United States Patent
Keller et al.

(10) Patent No.: US 9,634,191 B2
(45) Date of Patent: Apr. 25, 2017

(54) WIRE BOND FREE WAFER LEVEL LED

(75) Inventors: Bernd Keller, Santa Barbara, CA (US); Ashay Chitnis, Goleta, CA (US); Nicholas W. Medendorp, Jr., Raleigh, NC (US); James Ibbetson, Santa Barbara, CA (US); Max Batres, Vashon Island, WA (US)

(73) Assignee: CREE, INC., Goleta, CA (US)

(*) Notice: Subject to any disclaimer, the term of this patent is extended or adjusted under 35 U.S.C. 154(b) by 0 days.

(21) Appl. No.: 11/985,410

(22) Filed: Nov. 14, 2007

(65) Prior Publication Data

US 2009/0121241 A1 May 14, 2009

(51) Int. Cl.
*H01L 33/00* (2010.01)
*H01L 33/38* (2010.01)
(Continued)

(52) U.S. Cl.
CPC ............ *H01L 33/385* (2013.01); *H01L 33/50* (2013.01); *H01L 33/58* (2013.01); *H01L 33/22* (2013.01);
(Continued)

(58) Field of Classification Search
CPC ..... H01L 33/385; H01L 33/22; H01L 33/486; H01L 33/62; H01L 2224/49107;
(Continued)

(56) References Cited

U.S. PATENT DOCUMENTS

| | | | |
|---|---|---|---|
| 4,824,767 A | 4/1989 | Chambers et al. | 430/314 |
| 5,563,079 A | 10/1996 | Shin et al. | 438/571 |

(Continued)

FOREIGN PATENT DOCUMENTS

| | | |
|---|---|---|
| CN | 1871713 | 11/2006 |
| CN | 101027795 | 8/2007 |

(Continued)

OTHER PUBLICATIONS

Windisch et al. "Impact of Texture-Enhanced Transmission on High-Efficiency Surface-Textured Light-Emitting Diodes", Applied Physics Letters vol. 79, No. 15, Oct. 2001, pp. 2315-2317.

(Continued)

*Primary Examiner* — Thinh T Nguyen
(74) *Attorney, Agent, or Firm* — Koppel, Patrick, Heybl & Philpott (57) ABSTRACT

A wire-bond free semiconductor device with two electrodes both of which are accessible from the bottom side of the device. The device is fabricated with two electrodes that are electrically connected to the oppositely doped epitaxial layers, each of these electrodes having leads with bottom-side access points. This structure allows the device to be biased with an external voltage/current source, obviating the need for wire-bonds or other such connection mechanisms that must be formed at the packaging level. Thus, features that are traditionally added to the device at the packaging level (e.g., phosphor layers or encapsulants) may be included in the wafer level fabrication process. Additionally, the bottom-side electrodes are thick enough to provide primary structural support to the device, eliminating the need to leave the growth substrate as part of the finished device.

30 Claims, 7 Drawing Sheets

(51) Int. Cl.
*H01L 33/58* (2010.01)
*H01L 33/50* (2010.01)
*H01L 33/22* (2010.01)
*H01L 33/48* (2010.01)
*H01L 33/62* (2010.01)
*H01L 33/46* (2010.01)

(52) U.S. Cl.
CPC ............ *H01L 33/46* (2013.01); *H01L 33/486* (2013.01); *H01L 33/62* (2013.01); *H01L 2224/45139* (2013.01); *H01L 2224/48091* (2013.01); *H01L 2224/49107* (2013.01)

(58) Field of Classification Search
CPC ........... H01L 2224/48091; H01L 33/46; H01L 2924/00014; H01L 25/0753; H01L 33/50
USPC ......... 257/96, 97, 98, 99, E21.499, E21.502, 257/E33.068; 438/22, 25, 26, 27, 29
See application file for complete search history.

(56) References Cited

U.S. PATENT DOCUMENTS

| | | | |
|---|---|---|---|
| 5,712,175 A | 1/1998 | Yoshida | 438/167 |
| 5,803,579 A | 9/1998 | Turnbull et al. | |
| 5,959,316 A | 9/1999 | Lowrey | 257/98 |
| 6,132,072 A | 10/2000 | Turnbull et al. | |
| 6,212,213 B1 | 4/2001 | Weber et al. | |
| 6,234,648 B1 | 5/2001 | Borner et al. | |
| 6,375,340 B1 | 4/2002 | Biebl | |
| 6,395,572 B1 | 5/2002 | Tsutsui et al. | |
| 6,480,389 B1 | 11/2002 | Shie | |
| 6,486,499 B1* | 11/2002 | Krames | H01L 33/025 257/103 |
| 6,489,637 B1 | 12/2002 | Sakamoto | |
| 6,513,949 B1 | 2/2003 | Marshall et al. | |
| 6,538,371 B1 | 3/2003 | Duggal et al. | |
| 6,547,249 B2 | 4/2003 | Collins et al. | |
| 6,550,949 B1 | 4/2003 | Bauer et al. | |
| 6,552,495 B1 | 4/2003 | Chang | |
| 6,577,073 B2 | 6/2003 | Shimizu et al. | |
| 6,614,172 B2* | 9/2003 | Chiu | H01L 33/22 257/100 |
| 6,642,652 B2* | 11/2003 | Collins et al. | 313/512 |
| 6,646,292 B2* | 11/2003 | Steigerwald | H01L 33/02 257/103 |
| 6,650,044 B1* | 11/2003 | Lowery | 313/502 |
| 6,657,236 B1* | 12/2003 | Thibeault et al. | 257/98 |
| 6,692,136 B2 | 2/2004 | Marshall et al. | |
| 6,784,463 B2 | 8/2004 | Camras et al. | |
| 6,791,259 B1 | 9/2004 | Stokes | |
| 6,809,347 B2 | 10/2004 | Tasch et al. | |
| 6,817,735 B2 | 11/2004 | Shimizu et al. | |
| 6,828,596 B2* | 12/2004 | Steigerwald et al. | 257/99 |
| 6,841,804 B1 | 1/2005 | Chen et al. | |
| 6,869,812 B1 | 3/2005 | Liu | |
| 6,914,267 B2 | 7/2005 | Fukasawa et al. | |
| 6,936,857 B2 | 8/2005 | Doxsee et al. | |
| 6,946,309 B2* | 9/2005 | Camras et al. | 438/26 |
| 6,972,438 B2 | 12/2005 | Li et al. | 257/98 |
| 7,005,679 B2 | 2/2006 | Tarsa et al. | |
| 7,008,078 B2 | 3/2006 | Shimizu et al. | |
| 7,014,336 B1 | 3/2006 | Ducharme et al. | |
| 7,066,623 B2 | 6/2006 | Lee et al. | |
| 7,095,056 B2 | 8/2006 | Vitta et al. | |
| 7,141,825 B2 | 11/2006 | Horio et al. | 257/79 |
| 7,154,125 B2* | 12/2006 | Koide et al. | 257/95 |
| 7,160,744 B2* | 1/2007 | Park et al. | 438/29 |
| 7,192,797 B2 | 3/2007 | Tu et al. | |
| 7,213,940 B1 | 5/2007 | Van De Ven et al. | |
| 7,341,878 B2* | 3/2008 | Krames | B82Y 30/00 257/E21.379 |
| 7,348,212 B2* | 3/2008 | Schiaffino et al. | 438/106 |
| 7,388,232 B2* | 6/2008 | Suehiro et al. | 257/98 |
| 7,420,218 B2 | 9/2008 | Nagai | |
| 7,439,166 B1 | 10/2008 | Milosavljevic et al. | 438/577 |
| 7,453,092 B2* | 11/2008 | Suehiro | H01L 33/22 257/103 |
| 7,521,862 B2* | 4/2009 | Mueller et al. | 313/506 |
| 7,622,742 B2 | 11/2009 | Kim et al. | 257/79 |
| 7,683,377 B2 | 3/2010 | Nagai | 257/79 |
| 7,709,282 B2* | 5/2010 | Fukshima | H01L 33/005 257/E21.499 |
| 7,714,342 B2 | 5/2010 | Lee et al. | 257/98 |
| 7,755,095 B2 | 7/2010 | Nagai | 257/88 |
| 7,781,791 B2 | 8/2010 | Sakai et al. | 257/98 |
| 8,106,417 B2 | 1/2012 | Yoo | 257/99 |
| 9,129,977 B2 | 9/2015 | Marchand | 257/183 |
| 9,178,121 B2 | 11/2015 | Edmond | 257/103 |
| 9,219,200 B2 | 12/2015 | Erchak | 313/498 |
| 2002/0125485 A1* | 9/2002 | Steigerwald | H01L 33/02 257/79 |
| 2002/0139987 A1 | 10/2002 | Collins | |
| 2002/0180351 A1 | 12/2002 | McNulty | |
| 2002/0185965 A1* | 12/2002 | Collins, III | H01L 33/505 313/501 |
| 2002/0190260 A1* | 12/2002 | Shen | H01L 33/025 257/81 |
| 2003/0030063 A1 | 2/2003 | Sosniak et al. | |
| 2003/0146411 A1 | 8/2003 | Srivastava et al. | |
| 2004/0016936 A1 | 1/2004 | Tanaka et al. | |
| 2004/0041222 A1 | 3/2004 | Loh | |
| 2004/0105261 A1 | 6/2004 | Ducharme et al. | |
| 2004/0217364 A1 | 11/2004 | Tarsa et al. | |
| 2005/0082562 A1 | 4/2005 | Ou et al. | |
| 2005/0082974 A1 | 4/2005 | Fukasawa et al. | |
| 2005/0139252 A1 | 6/2005 | Shim | |
| 2005/0211989 A1 | 9/2005 | Horio et al. | |
| 2005/0221527 A1* | 10/2005 | Yeh | H01L 33/22 438/46 |
| 2005/0224821 A1 | 10/2005 | Sakano | |
| 2006/0012989 A1 | 1/2006 | Lee | |
| 2006/0038190 A1* | 2/2006 | Park | H01L 33/007 257/95 |
| 2006/0043402 A1* | 3/2006 | Suehiro | H01L 33/22 257/99 |
| 2006/0054907 A1 | 3/2006 | Lai | 257/96 |
| 2006/0063289 A1 | 3/2006 | Negley | |
| 2006/0081869 A1* | 4/2006 | Lu et al. | 257/99 |
| 2006/0105482 A1 | 5/2006 | Alferink et al. | |
| 2006/0169994 A1* | 8/2006 | Tu | H01L 33/385 257/89 |
| 2006/0202105 A1* | 9/2006 | Krames | B82Y 30/00 250/208.1 |
| 2006/0273333 A1 | 12/2006 | Wu et al. | 257/94 |
| 2006/0273335 A1 | 12/2006 | Asahara | |
| 2007/0018182 A1 | 1/2007 | Beeson et al. | |
| 2007/0018184 A1 | 1/2007 | Beeson et al. | |
| 2007/0057271 A1 | 3/2007 | Schiaffino et al. | |
| 2007/0102693 A1 | 5/2007 | Nagai | 257/13 |
| 2007/0109779 A1 | 5/2007 | Sekiguchi | |
| 2007/0145392 A1 | 6/2007 | Haberem | |
| 2007/0181895 A1* | 8/2007 | Nagai | H01L 33/0079 257/98 |
| 2007/0202624 A1 | 8/2007 | Yoon et al. | 438/29 |
| 2007/0262338 A1* | 11/2007 | Higashi et al. | 257/99 |
| 2008/0157115 A1 | 7/2008 | Chuang et al. | 257/99 |
| 2008/0179602 A1 | 7/2008 | Negley et al. | |
| 2008/0211416 A1 | 9/2008 | Negley et al. | |
| 2008/0217635 A1 | 9/2008 | Emerson | |
| 2009/0008654 A1 | 1/2009 | Nagai | |
| 2009/0072251 A1 | 3/2009 | Chan et al. | |
| 2009/0096386 A1 | 4/2009 | Yeh et al. | |
| 2009/0109151 A1 | 4/2009 | Kim et al. | |
| 2009/0121241 A1 | 5/2009 | Keller et al. | |
| 2009/0129085 A1 | 5/2009 | Aizar et al. | 362/247 |
| 2009/0261356 A1 | 10/2009 | Lee et al. | |
| 2009/0267085 A1 | 10/2009 | Lee et al. | |
| 2009/0283781 A1 | 11/2009 | Chan et al. | |
| 2009/0283787 A1 | 11/2009 | Donofrio et al. | |
| 2010/0059733 A1 | 3/2010 | Shei et al. | |
| 2010/0155746 A1 | 6/2010 | Ibbetson et al. | |

(56) References Cited

U.S. PATENT DOCUMENTS

FOREIGN PATENT DOCUMENTS

| | | |
|---|---|---|
| JP | 4284620 | 10/1992 |
| JP | 08111544 A | 4/1996 |
| JP | 9129532 | 5/1997 |
| JP | 09008403 | 10/1997 |
| JP | 10-163535 | 6/1998 |
| JP | 2000311704 | 7/2000 |
| JP | 2001-308380 | 11/2001 |
| JP | 2003-515956 | 5/2003 |
| JP | 2003209286 | 7/2003 |
| JP | 2003-529889 | 10/2003 |
| JP | 2004-080046 | 3/2004 |
| JP | 2004-103443 | 4/2004 |
| JP | 2004-266240 | 9/2004 |
| JP | 2004-356116 | 12/2004 |
| JP | 2005-142311 | 6/2005 |
| JP | 2005527102 A | 8/2005 |
| JP | 2005286291 | 10/2005 |
| JP | 2006032779 | 2/2006 |
| JP | 2006100787 | 4/2006 |
| JP | 2006216933 | 8/2006 |
| JP | 2006352085 | 12/2006 |
| JP | 2007511065 | 4/2007 |
| JP | 2007529879 | 10/2007 |
| KR | 2002-77135 | 10/2002 |
| WO | WO 83/00408 A1 | 2/1983 |
| WO | WO 03032397 A2 | 4/2003 |
| WO | WO 2005048361 A2 | 5/2005 |
| WO | WO 2005/124877 | 12/2005 |
| WO | WO 2006035664 A | 4/2006 |
| WO | WO 2007/141763 A1 | 12/2007 |
| WO | WO 2009/039805 A1 | 4/2009 |

OTHER PUBLICATIONS

Schnitzer et al. "30% External Quantum Efficiency Prom Surface Textured, Thin-Film Light-Emitting Diodes", Applied Physics Letters, Oct. 18, 1993, No. 16, vol. 64, Oct. 1993, pp. 2174-2176.
Windisch et al. "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.
Streubel, et al. "High Brightness AlGaInP Light-Emitting Diodes", IEEE Journal on Selected Topics in Quantum Electronics, vol. 8, No. 2, Mar./Apr. 2002, pp. 321-332.
Nichia Corp. White LED, Part No. NSPW300BS.
Nichia Corp. White LED Part No. NSPW312BS.
PCT International Search Report and Written Opinion from related PCT application No. PCT/US2008/010703, date: Aug. 26, 2009.
US Publication No. US 2007/0057271 A1, to Schiaffino, et al. dated: Mar. 15, 2007.
US Publication No. US 2007/0262338 A1, to Higashi et al., dated: Nov. 15, 2007.
US Publication No. US 2005/0077531 A1, to Kim, dated: Apr. 14, 2005.
US Publication No. US 2005/0104080 A1, to Ichihara, dated: May 19, 2005.
US Publication No. US 2007/0200127 A1, to Andrews et al., dated: Aug. 30, 2007.
U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
PCT International Preliminary Report, Date: Mar. 27, 2008, PCT/US05/20603.
From related application: European Office Action dated Dec. 12, 2009.
George Craford, Philips Lumileds Lighting Company, "Light Extraction From LEDs", *Session J3: Emerging Science of Solid State Lighting—Current State of the Art in High Brightness LEDs*, p. 7, 2007 American Physical Society March Meeting, vol. 52, No. 1 (Mar. 6, 2007).
LEDs Magazine—Lumileds Introduces Thin Film Flip Chips to Boost LED Brightness, Jul. 11, 2007, available at http://ledsmagazine.com/news/4/7/16.
Second Office Action from Chinese Patent Appl. No. 200580124595.4, dated Jan. 6, 2013.
Notice of Reasons for Rejection for Japanese Patent Appl. No. 2009-132243, dated Dec. 16, 2011.
Office Action from U.S. Appl. No. 12/432,478, dated: Nov. 17, 2010.
Response to Office Action from U.S. Appl. No. 12/432,478, filed Mar. 17, 2011.
Office Action from U.S. Appl. No. 11/904,064, dated: Apr. 22, 2011.
Response to Office Action from U.S. Appl. No. 11/904,064, filed Jul. 22, 2011.
Office Action from U.S. Appl. No. 12/432,478, dated: May 16, 2011.
Office Action from U.S. Appl. No. 12/012,376, dated: Jul. 8, 2010.
Response to Office Action from U.S. Appl. No. 12/012,376, filed Sep. 28, 2010.
Office Action from U.S. Appl. No. 12/012,376, dated: Dec. 3, 2010.
Response to Office Action from U.S. Appl. No. 12/012,376, filed Jan. 26, 2011.
Office Action from U.S. Appl. No. 12/012,376, dated: Feb. 22, 2011.
Response to Office Action from U.S. Appl. No. 12/012,376, filed Mar. 22, 2011.
U.S. Patent Application Publication No. US 2005/0147923, Sawada, Ken, Jul. 2005.
U.S. Patent Application Publication No. US 2008/0182369, Jeong et al., Jul. 2008.
U.S. Patent Application Publication No. US 2008/0251858, Ahn et al., Oct. 2008.
U.S. Patent Application Publication No. US 2003/0218183 A1. Micovic et al., Nov. 2003.
U.S. Patent Application Publication No. US 2008/0241757, Xu et al., Oct. 2008.
Grundbacher et al., "Utilization of an Electron Beam Resist Process to Examine the Effects of Asymmetric Gate Recess on the Device Characteristics of AlGaAs/InGaAs PHEMT's," IEEE, vol. 44. No. 12. Dec. 1997.

(56) References Cited

OTHER PUBLICATIONS

Notice of Allowance from U.S. Appl. No. 12/012,376, dated: May 13, 2011.
U.S. Patent Application Publication No. US 2007/0102715, Ko et al., May 2007.
U.S. Patent Application Publication No. US 2009/0283787, Donofrio et al., Nov. 2009.
U.S. Patent Application Publication No. US 2009/0140272, Beeson et al., Jun. 2009.
U.S. Patent Application Publication No. US 2007/0111473, Furukawa et al., May 2007.
U.S. Patent Application Publication No. US 2007/0063215, Kohda, Shinichi, Mar. 2007.
U.S. Patent Application Publication No. US 2008/0237640, Mishra et al., Oct. 2008.
U.S. Patent Application Publication No. US 2008/0230799, Wang et al., Sep. 2008.
Notice of for Rejection from Japanese Patent appl. No. 2012-212830, dated Jan. 21, 2014.
Second Office Action from Chinese Patent Appl. No. 200980149197.2, dated Dec. 30, 2013 (received Feb. 18, 2014).
Reasons for Rejection from Japanese Patent Appl. No. 2012-212830, dated Aug. 27, 2013.
Office Action from U.S. Appl. No. 12/905,995, dated Jan. 11, 2013.
Response to OA from U.S. Appl. No. 12/905,995, filed Apr. 5, 2013.
Office Action from U.S. Appl. No. 12/329,713, dated Feb. 27, 2013.
Response to OA from U.S. Appl. No. 12/329,713, filed Apr. 23, 2013.
Office Action from U.S. Appl. No. 12/329,713, dated Oct. 15, 2012.
Response to OA from U.S. Appl. No. 12/329,713, filed Jan. 14, 2013.
International Search Report and Written Opinion for Patent Application No. PCT/US2011/001741, mailed Feb. 14, 2012.
Notice of Reasons for Rejection from Japanese Patent Application 2010-534010, dated Jun. 26, 2012.
Written Opinion of the International Search Authority for PCT Application No. PCT/US2009/066743 filed Dec. 14, 2009.
Decision of Rejection from Japanese Patent Application No. 2010-534010, dated Apr. 16, 2013.
Office Action and Search Report for Chinese Patent Application No. 200980149197.2, dated Nov. 15, 2012.
Final Office Action from U.S. Appl. No. 12/321,059, mailed Sep. 24, 2010.
Response to Final Office Action, U.S. Appl. No. 12/321,059, filed Nov. 23, 2010.
Office Action from U.S. Appl. No. 12/321,059, mailed Feb. 11, 2011.
Response to Office Action, U.S. Appl. No. 12/321,059, filed Jun. 13, 2011.
Office Action from U.S. Appl. No. 12/329,713, mailed Aug. 3, 2011.
Response to Office Action U.S. Appl. No. 12/329,713, filed Dec. 5, 2011.
Final Office Action from U.S. Appl. No. 12/329,713, mailed Feb. 11, 2011.
Response to Final Office Action, U.S. Appl. No. 12/329,713, filed Jul. 8, 2011.
Office Action from U.S. Appl. No. 12/329,713, mailed Sep. 1, 2010.
Response to Office U.S. Appl. No. 12/329,713, filed Dec. 1, 2010.
Office Action U.S. Appl. No. 12/418,816, mailed Apr. 16, 2010.
Response to Office Action U.S. Appl. No. 12/418,816, filed Aug. 11, 2010.
Office Action from U.S. Appl. No. 12/418,816, mailed Oct. 29, 2010.
Response to Office Action U.S. Appl. No. 12/418,816, filed Feb. 28, 2011.
Office Action from U.S. Appl. No. 12/418,816, mailed Aug. 20, 2010.
Response to Office Action U.S. Appl. No. 12/418,816, filed Oct. 20, 2010.
Office Action from U.S. Appl. No. 12/329,713, mailed Feb. 15, 2012.
Response to Office Action U.S. Appl. No. 12/329,713, filed Aug. 15, 2012.
Office Action from U.S. Appl. No. 12/821,069, dated: Dec. 28, 2010.
Office Action from U.S. Appl. No. 12/002,429, dated: Jan. 28, 2011.
U.S. Patent Application Publication No. US 2003/012475, Wei et al., Jul. 2003.
International Search Report and Written Opinion for PCT application No. PCT/US2010/024980 mailed Oct. 6, 2010.
Office Action for German Patent Application No. 10 2008 029 318.0 dated mailed Dec. 13, 2010.
Extended European Search Report for European Patent Application No. 10185708.4 mailed Dec. 2, 2010.
Office Action for Korean Patent Application No. 10-2005-7020463 mailed Dec. 21, 2010.
Decision of Rejection from Japanese Patent Application No. 2009-132243, dated Oct. 2, 2012.
Office Action from Korean Patent Appl. No. 52003035292, dated Aug. 22, 2014.
Third Office Action from Chinese Appl No. 2009801491972, dated Sep. 2, 2014.
Decision of Dismissal of Amendment from Japanese Appl. No. 2012-212830, dated Nov. 13, 2014.
Notice of Allowance of Patent from Korean Patent Appl. No. 10-2010-7013082, dated Jan. 30, 2015.
Decision of Rejection from Chinese Patent Appl. No. 200980149197.2, dated Mar. 25, 2015.
Decision of Patent Grant from Japanese Appl. No. 2012-212830, dated May 19, 2015.
Decision of Rejection from Chinese Patent appl No. 2009801491972, dated Mar. 25, 2015.
First Office Action from Chinese Patent Appl. No. 2011800608702, dated Jul. 1, 2015.
Second Office Action from Chinese Patent appl No. 201180060870.2, dated Nov. 11, 2015.
Notice of Issuance for Appl. No. 201180060870.2; Mar. 21, 2016.
First Office Action from Chinese Patent Application No. 200910137491.3 mailed Apr. 14, 2010.

\* cited by examiner

WIRE BOND FREE WAFER LEVEL LED

This invention was made with Government support under Contract No. 70NANB4H3037 of the Department of Commerce. The Government has certain rights in this invention.

BACKGROUND OF THE INVENTION

Field of the Invention

This invention relates to semiconductor devices, and in particular to light emitting devices capable of wire bond free fabrication and operation.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light from the active layer is emitted from all surfaces of the LED.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the difference in the refractive index between the LED semiconductor and surrounding ambient, as predicted by Snell's Law. This difference results in a small escape cone from which light rays from the active area can transmit from the LED surfaces into the surrounding material and ultimately escape from the LED package.

Different approaches have been developed to reduce TIR and improve overall light extraction, with one of the more popular being surface texturing. Surface texturing increases the escape probability of the light by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol. 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,657,236, assigned to Cree Inc., discloses structures for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light refracts or scatters. Also, a reflective material may be used to coat one or more of the layers of the device to enhance light extraction by reflecting light emitted from the active layers away from the substrate or other photon absorbing materials.

Another method used to fabricate more efficient semiconductor devices is called flip-chip mounting. Flip-chip mounting of LEDs involves mounting the LED onto a submount substrate-side up. Light is then extracted and emitted through the transparent substrate, or the substrate may be removed altogether. Flip-chip mounting is an especially desirable technique for mounting SiC-based LEDs. Since SiC has a higher index of refraction than GaN, light generated in the active region does not internally reflect (i.e. reflect back into the GaN-based layers) at the GaN/SiC interface. Flip-chip mounting of SiC-based LEDs offers improved light extraction when employing certain chip-shaping techniques known in the art. Flip-chip packaging of SiC LEDs has other benefits as well, such as improved heat extraction/dissipation, which may be desirable depending on the particular application for the chip.

Significant effort has been invested in developing a white light LED. Conventional LEDs cannot generate white light, i.e., a broad spectrum, directly from their active layers. Light from a blue emitting LED has been converted to white light by surrounding the LED with a yellow emitting phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the wavelength of some of the blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

Figure 1:
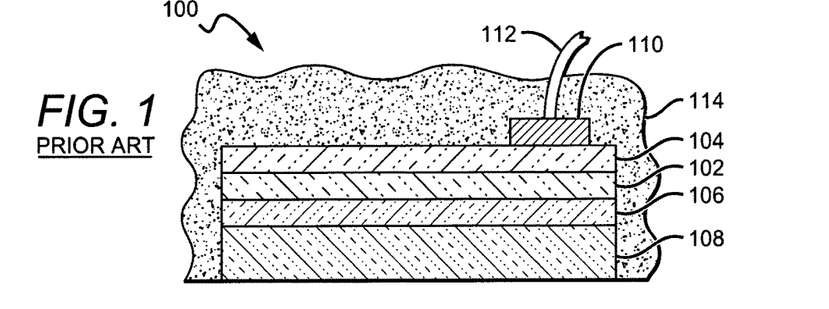
FIG. 1 is a cross-sectional view of an LED device according to a known embodiment disclosed in the prior art.
Figure 2A:
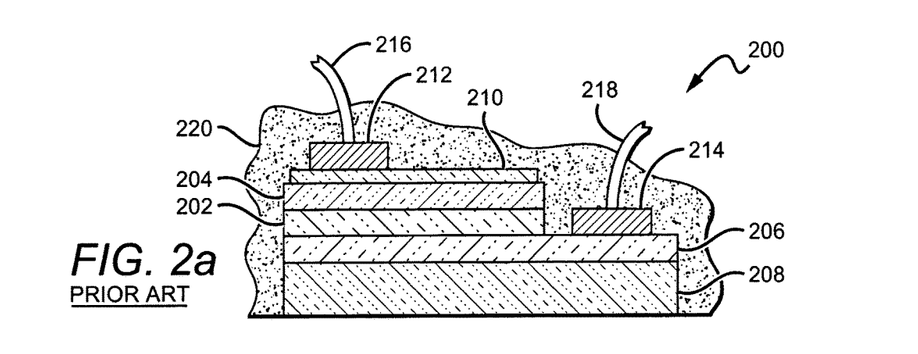
FIG. 2a is a cross-sectional view of another embodiment of an LED device according to a known embodiment disclosed in the prior art.
Figure 2B:
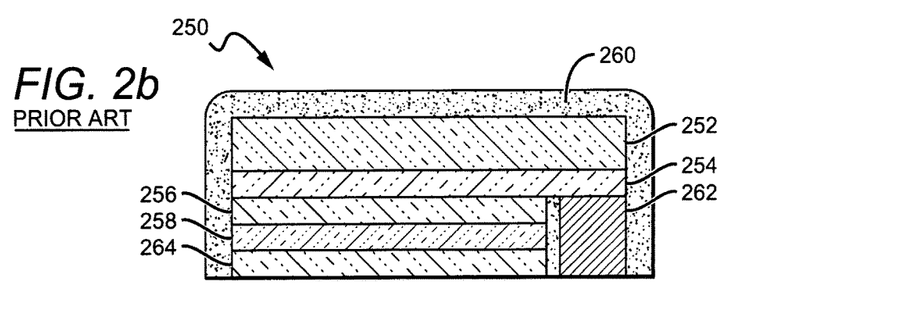
FIG. 2b is a cross-sectional view of another embodiment of a flip-chip LED device according to a known embodiment disclosed in the prior art.

LED devices are often described as having a vertical geometry or a lateral geometry as shown in FIGS. 1 and 2, respectively. Both configurations are known in the art. Vertical geometry devices typically feature p-contact and n-contact electrodes on opposite surfaces of the device. Charge carriers move vertically through the semiconductor layers in response to a bias. Lateral geometry devices are usually arranged with a split-level electrode configuration with both electrodes on the top surface of layers on different levels of the device. Thus, the electrodes do not share a common surface but rather a common top-side orientation with respect to the layers on which they are disposed. Charge carriers move laterally through the semiconductor layers for at least a portion of the current path in response to a bias. Several variations of these common geometries are known and used in the art.

FIG. 1 illustrates a vertical geometry nitride LED 100 that is known and used in the art. An active region 102 is interposed between p-type layer 104 and n-type layer 106. The semiconductor layers are grown on a conductive substrate 108. A thin semi-transparent current spreading contact 110 covers most or all of the p-type layer. A bias is applied to the device 100 using electrode 112 and substrate 108. Electrode 112 is connected to an outside voltage source (not shown) via wire 114. The substrate 108 may be connected to the voltage source with solder bumps, pads or wires on the bottom side of the wafer 108. Phosphor layer 118 covers all the surfaces of the device with wire 114 protruding through the phosphor layer 118.

In response to an applied bias, current and charge carriers move through the device 100 vertically with respect to the semiconductor surfaces. Radiative recombination occurs in the active region 102 and light is emitted. Some of the emitted light has its wavelength downconverted in the phosphor layer, resulting in a desired emission spectrum.

FIG. 2a illustrates an LED device 200 having a split-level lateral geometry that is known and used in the art. An active region 202 is interposed between p-type layer 204 and n-type layer 206. The semiconductor layers are grown on a substrate 208. A thin semi-transparent current spreading contact 210 covers most or all of the p-type layer. A bias is applied to the device 200 using p-contact electrode 212 and n-contact electrode 214. Wires 216, 218 provide connections to an outside voltage source (not shown). A phosphor layer 220 covers all the surfaces of the device with wires 216, 218 protruding through the phosphor layer 220.

The bias is applied to the device 200 through electrodes 212, 214. Current and charge carriers move laterally through the device between the electrodes 212, 214. A percentage of the carriers recombine in the active region 202, causing light to be emitted. Some of the emitted light has its wavelength downconverted in the phosphor layer 220, enabling the device to emit light with desired wavelength spectrum.

FIG. 2b illustrates a known LED device 250 similar to the device 200 shown in FIG. 2a. The device 250 features the flip-chip configuration with the growth substrate 252 disposed above the n-type layer 254, the active region 256, and the p-type layer 258. After the semiconductor layers 254, 256, 258 are grown on the growth substrate 252, the device 250 is flipped and mounted to a surface. Thus, the device emits light through the growth substrate. This configuration requires a transparent substrate so that the light may escape the device primarily through the top surface. A phosphor layer 260 coats the entire device and downconverts a portion of the light emitted from the active region 258. An n-contact electrode 262 and a reflective p-contact electrode 264 are disposed on the bottom side of the device 250 to provide the necessary bias for radiative recombination. The device 250 emits light from the active region 256, most of which is emitted out the top surface of the device 250. A portion of the light is absorbed and/or back-scattered by the growth substrate 252 before it is emitted.

Figure 3:
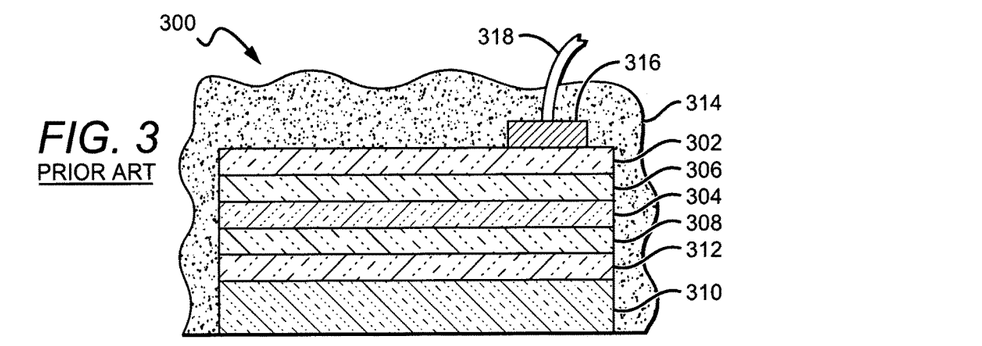
FIG. 3 is a cross-sectional view of a flip-chip LED device according to a known embodiment disclosed in the prior art.

FIG. 3 depicts a typical flip-chip LED device 300 having a vertical geometry configuration that is known in the art. Oppositely doped n-type layer 302 and p-type layer 304 sandwich the active region 306. A reflective element 308, such as a mirror, is shown bonded to a carrier wafer 310 with a metal bond 312. In this particular configuration the LED device 300 has been flip-chip mounted, and the reflective element 308 is adjacent to p-type layer 304. The n-type layer 302, the p-type layer 304 and active region 306 are grown on a growth substrate (not shown) that is subsequently removed. The exposed surface of the n-type layer 302 is textured or roughened to improve light extraction. A layer of conversion material 314, such as phosphor for example, can be disposed over an n-pad 316 that provides a surface to which a wire 318 can be bonded. The wire 318 connects the device to an external voltage/current source (not shown). In this particular device 300 because n-type layer 302, p-type layer 304 and active region 306 are very thin and the growth substrate is removed, the phosphor layer only needs to coat the top surface.

One disadvantage inherent to all of these exemplary configurations is that their design prevents package level components such as, for example, a phosphor layer or an encapsulation structure from being applied until after the device is singulated and mounted in a conventional LED package. In some cases the constraint is caused by the need to connect the device to an outside voltage source using a wire bond or other similar means of connection. In other cases the constraint is caused by the need to coat the sides of the substrate with phosphor to prevent too much blue light from escaping without being downconverted.

SUMMARY OF THE INVENTION

The invention as embodied in the claims discloses a new semiconductor device, such as an LED chip, that has two bottom-side electrical contacts, allowing for wire bond free fabrication. One embodiment of a semiconductor device according to the present invention comprises an active region interposed between an n-type semiconductor layer and a p-type semiconductor layer. A p-electrode is disposed such that a lead is accessible from a point on the surface of the device opposite the primary emission surface. The p-electrode is electrically connected to the p-type layer. An n-electrode is also disposed such that a lead is accessible from a point on the surface of the device opposite the primary emission surface. The n-electrode is electrically connected to the n-type layer. The p-electrode and the n-electrode are thick enough to provide primary mechanical support for the semiconductor device.

Another embodiment of a semiconductor device having top and bottom surfaces and first and second edge surfaces comprises a base element thick enough to provide structural support for said semiconductor device. An active region is interposed between a first semiconductor layer and a second semiconductor layer such that the second semiconductor layer is disposed on the base element. A first electrode electrically contacts the first semiconductor layer and has a lead that is accessible from the bottom surface. The first electrode is disposed substantially perpendicular to the bottom surface and constitutes at least a portion of the first edge surface. A first spacer layer is disposed to isolate the first electrode from the second semiconductor layer and the base element.

A method for fabricating semiconductor devices according to the present invention is also disclosed. First and second semiconductor layers and an active region are grown on a growth substrate. A portion of the surface of the first semiconductor layer opposite the growth substrate is exposed. A spacer layer is formed on the second semiconductor layer and the exposed portion of the first semiconductor layer. A portion of the spacer layer is removed such that a portion of the first and second semiconductor layers is exposed. An electrode layer is formed on the remaining portions of the spacer layer and the exposed portions of the first and second semiconductor layers. The growth substrate is removed. A portion of the electrode layer is removed to form first and second electrodes such that the first electrode is electrically contacting the first semiconductor layer and the second electrode is electrically contacting the second semiconductor layer. The first and second electrodes are disposed to be electrically isolated from one another.

Another embodiment of a semiconductor device comprises an n-type semiconductor layer, a p-type semiconductor layer having at least one via, and an active region interposed between the n-type and p-type layers. The active region has at least one via corresponding to the at least one via in the p-type layer, such that a portion of the n-type layer adjacent to the active region is exposed. The at least one p-electrode has a lead that is accessible on a surface opposite of a primary emission surface of the semiconductor device. The at least one p-electrode is electrically connected to the p-type layer. The at least one n-electrode has a lead that is accessible on a surface opposite of the primary emission surface. The at least one n-electrode is electrically connected to the n-type layer. The at least one p-electrode and the at least one n-electrode are thick enough to provide primary mechanical support for the semiconductor device.

These and other aspects and advantages of the invention will become apparent from the following detailed description and the accompanying drawings which illustrate by way of example the features of the invention.

DETAILED DESCRIPTION OF THE INVENTION

The present invention as embodied in the claims enables wafer-level packaging of semiconductor devices, such as high efficiency light emitting diode (LED) devices, for example. The claims also teach a method for fabricating these devices. Similarly as in other semiconductor devices, a bias voltage is applied across the device and light is emitted as a result of radiative recombination in the active region of the device. Various elements and procedures can be used to increase the light output of the device. For example, layers of materials functioning as mirrors or refractors can be formed at certain locations within the device to redirect emitted light away from photon absorbing materials such as the substrate. Another method often employed in the art is to roughen or texture one or more of the layers to prevent total internal reflection. Such features are typically added at the wafer level of fabrication.

It is sometimes desirable to alter the emission spectrum of an LED device by shifting the frequency of a portion of the emitted light using a layer of material with wavelength conversion properties, such as phosphor, for example. In order to shape an optical beam or otherwise alter the properties of the emitted light, an encapsulant may be added over the device. These encapsulants typically have characteristics that affect the emitted light in some intended fashion. For example, an encapsulant may function as a lens, focusing or collimating the emitted light to achieve a particular beam profile. Features such as conversion layers and encapsulants, often referred to as packaging elements, are typically added to the device after a device has been mounted and wire bonded in a conventional LED package. Wire bonds are lead wires that provide electrical paths from an outside voltage/current source to the internal semiconductor layers, allowing a voltage bias to be applied to the device. Because the structures and methods disclosed in the claims obviate the need for wire bonds, packaging elements may be added to the device at the wafer level, i.e., prior to being mounted and wired bonded in a conventional LED package. The new design provides additional flexibility, permitting customers to specify additional features that may be realized at the wafer level. Also, because the features may be added to the chip at the wafer level rather than at a later packaging level, the cost to produce the chip is significantly reduced.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures. Additionally, terms such as "bottom" and "top" are used to describe the spatial relationship of elements to one another as they appear in a particular exemplary figure that is being discussed. Such terms are used only for the convenience of the reader and not for the purpose of limiting the device to a particular orientation during fabrication, operation or otherwise.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of semiconductor material may actually comprise several individual layers of material. Likewise, several "layers" of material may be considered functionally as a single layer. In other words, the term "layer" does not denote an homogenous layer of semiconductor material. A single "layer" may contain various dopant concentrations and alloy compositions that are localized in sub-layers. Such sub-layers may function as buffer layers, contact layers or etch-stop layers, for example. These sub-layers may be formed in a single formation step or in multiple steps. Unless specifically stated otherwise, the Applicant does not intend to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 4a-4g illustrate one embodiment of a semiconductor device 400 according to the present invention at various stages during a fabrication process. For ease of description and understanding, the device 400 is shown as an individual device during a fabrication process. It is understood, however, that semiconductor devices are typically fabricated at the wafer level with the individual devices singulated from the wafer in a subsequent processing step. Nonetheless, the process described herein can also be used for fabricating individual devices. It is also understood that although the fabrication steps are shown in a particular order below, the device 400 can be fabricated by steps in a different order and can include additional or fewer steps.

Figure 4A:
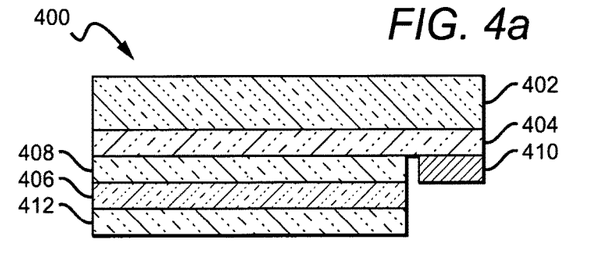
FIGS. 4a-4g are cross-sectional views of one embodiment of a semiconductor device according to the claims of the present invention shown at various stages of the fabrication process.

FIG. 4a shows epitaxial layers grown on a substrate 402. The oppositely doped n-type and p-type layers 404, 406 and active region 408 interposed between them are typically formed on a substrate 402 using known fabrication methods and devices, such as epitaxial growth in a metalorganic chemical vapor deposition (MOCVD) reactor. The semiconductor layers 404, 406, 408 can be from several different material systems with a preferred system being the Group-III nitride system. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). The active region 408 can comprise single quantum well (SQW), multiple quantum well (MQW), double heterostructure or super lattice structures. In a preferred embodiment, the n- and p-type layers 404, 406 are gallium nitride (GaN) and the active region 408 is a multiquantum well (MQW) structure having alternating layers of GaN and InGaN. In alternative embodiments the n- and p-type layers 404, 406 can be or may include Group III-nitride materials such as AlGaN or AlInGaN.

The substrate 402 can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide (SiC) has certain advantages, such as a closer crystal lattice match to Group III nitrides than sapphire and results in Group III nitride films of higher quality. SiC substrates are available from Cree Research, Inc., of Durham, N.C. and methods for producing them are set forth in the scientific literature as well as in U.S. Pat. Nos. Re. 34,861; 4,946,547; and 5,200,022.

Although it is possible to grow either n-type or p-type layers first on a growth substrate, it may be preferable to grow the n-type layers first. This is the case for several reasons that are known in the art. One reason for growing the n-type layers first is that they are grown at higher temperatures than the p-type layers; n-type layers are grown at temperatures around 1100° C., and p-type layers are grown around 900° C. When p-type layers are subjected to temperatures in excess of 900° C., the dopant material (often magnesium) can diffuse into adjacent layers, reducing the quality of the layer. Thus, once the n-type layers have been grown on the substrate, subsequent p-type layers can be grown at lower temperatures that do not substantially affect the n-type layers that have already been formed. Another reason for growing n-type layers first is that layers grown on the substrate must be grown for longer periods of time to overcome the lattice mismatch at the substrate interface. Layers grown longer are grown thicker. Because p-type layers are more light-absorbent than n-type layers, it is desirable to have a thicker n-type layer so that less emitted light is absorbed.

In FIG. 4a n-type layer 404 is shown grown first on substrate 402. Then, the active region 408 is formed on the n-type layer 404, and the p-type layer 406 is formed on the active region 408. The device is shown flipped upside down with the latter grown layers on bottom in FIG. 4a. As stated above, the active region 408 can comprise single quantum well (SQW), multiple quantum well (MQW), double heterostructure or superlattice structures. It is understood that additional layers and elements can also be included in the device 400, including but not limited to buffer, nucleation, contact and current spreading layers and superlattice structures on one or both sides of the active region 408 as well as light extraction layers and elements.

A portion of the n-type layer 404 is exposed using a known etching process, chlorine reactive ion etching for example, or another process that is known in the art. A conductive n-pad 410 is formed on an exposed portion of the n-type layer 404 which is shown extending laterally beyond the edges of the active region 408 and the p-type layer 406. A p-pad 412 is formed on the exposed surface of the p-type layer 406. The n-pad 410 and p-pad 412 function as contacts that will facilitate an electrical connection between the semiconductor layers 404, 406 and leads that will be added at a later stage in the fabrication process as discussed below. The pads 410, 412 may comprise a conductive metal material such as gold, silver or copper, for example.

In the configuration shown, p-pad 412 may be formed from a reflective material, such as aluminum, silver, gold, rhodium, platinum, palladium, gold tin or combinations thereof. These reflective materials can be deposited on the surface of p-type layer 406 using conventional methods, such as sputtering. Using a reflective material to form the p-pad 412 may increase the light extraction efficiency of the device 400 by redirecting light emitted from the active region 408 that might otherwise be absorbed by layers and elements below the p-pad, such as spacer elements or electrodes, both of which are discussed in detail below.

Figure 4B:
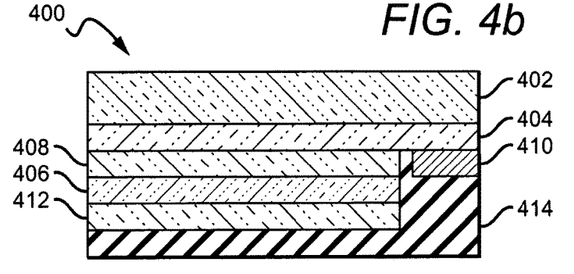

In FIG. 4b a layer of spacing material 414 is deposited on the device, coating the n-pad 410, the p-pad 412, and any exposed portion of bottom surface of the n-type layer 404. The spacing material should comprise an insulating material. A selectively patterned dielectric (e.g., SiN or $SiO_2$) or polymer (e.g., BCB or silicone) may be used as the spacing material.

Figure 4C:
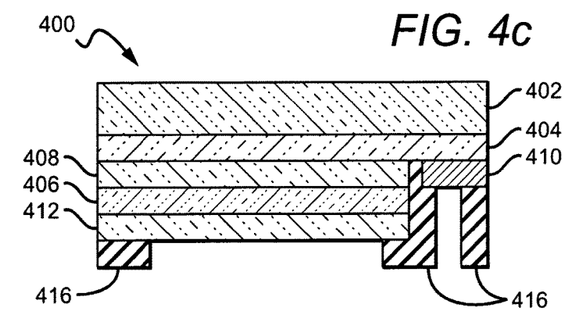

The spacing material is then patterned using a known process to expose a portion of both the n-pad 410 and the p-pad 412, leaving some of the spacing material 414 to remain, as shown in FIG. 4c. The remaining structures function as spacing elements 416. The spacing elements 416 are arranged to electrically isolate the n- and p-electrodes from each other. These electrodes are not formed until a later stage of fabrication (shown in FIG. 4g). The spacing elements can take various shapes and vary in dimension so long as at least a portion of both the n-pad 410 and the p-pad 412 are exposed for electrical connection.

Figure 4D:
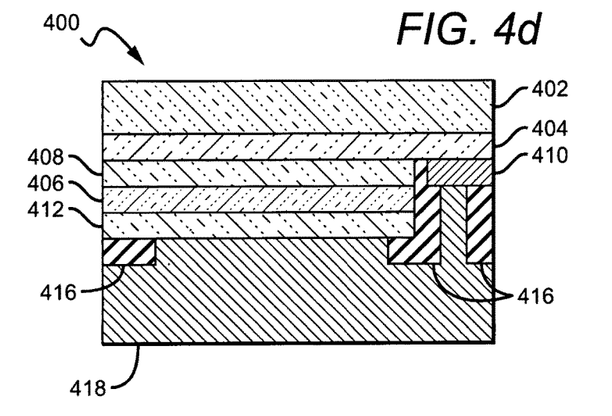

In FIG. 4d, a conductive metal layer 418 is deposited on the bottom side of the device 400, covering the spacing elements 416 and the exposed portions of both the n-pad 410 and the p-pad 412. The thick conductive metal layer 418 may be applied to the device 400 by different known methods such as electroplating, for example. The conductive metal layer 418 should be thick enough to provide mechanical support to the finished device. A layer should be at least 20 μm thick, with a preferred thickness in the range of 50-400 μm. Planarization and polishing steps may be employed to insure the final surface of the thick conductive metal layer is smooth and planar. Although several different metals and metal alloys can be used, copper (Cu) is a preferred material.

Figure 4E:
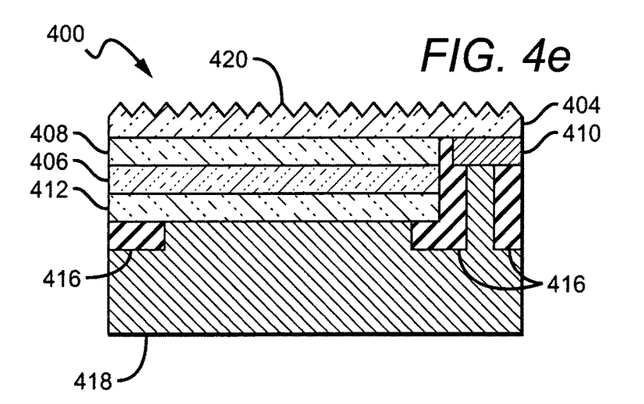

The substrate 402 may be removed and the top surface of the n-type layer 404 may be modified as shown in FIG. 4e. The substrate 402 can be removed by several known methods, including wet and dry etching processes, laser ablation, mechanical grinding, or a grinding/etching combination process. It is understood, however, that in other embodiments according to the present invention, part of the substrate 402 can remain on the n-type layer 404, and that the substrate 402 can be shaped or textured to enhance light extraction.

Once the n-type layer 404 is exposed, it may be processed in several different ways. It may be desirable to modify (e.g., texture or roughen) various surfaces on or within the device to provide a multitude of angled surfaces and increase light extraction. A modified surface improves light extraction by providing a varying surface that allows light that would otherwise be trapped in the LED, by total internal reflection (TIR), to escape as emitted light. The variations in the modified surface increase the chances that the light will reach an emission surface within the critical angle (as defined by Snell's law) and will be emitted. For light that does not escape through the modified surface, the variations of the modified surface reflect the light at different angles, increasing the chances that the light will escape on the next pass after reflecting off the p-pad.

There are several known methods by which a semiconductor surface may be modified. The surface may have portions removed by processes such as etching, grinding or ablation. It is also possible to add material, such as nanoparticles or light extraction elements for example, to the surface in order to give it a non-uniform texture. Adding light extraction structures to a surface within the device is discussed at length in U.S. Pat. No. 6,657,236 assigned to Cree, Inc. A combination of any of these processes may also achieve the desired surface modifications.

Although the modified surface 420 is shown as a surface of the n-type layer 404 opposite the active region 408 in FIG. 4e, it is understood that many different surfaces within the device 400 may be modified to achieve the same extraction enhancing effect. Also, device 400 might not have any modified surfaces.

Figure 4F:
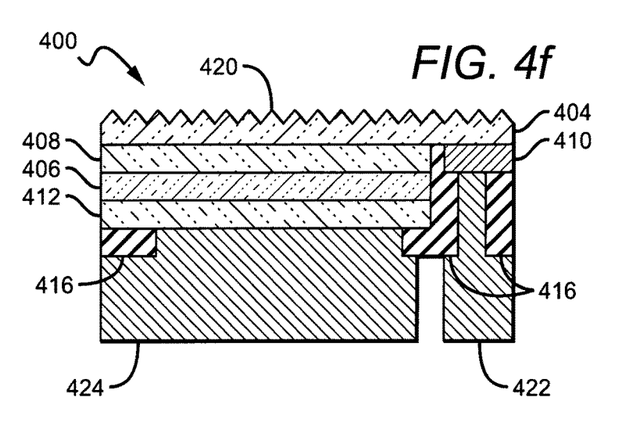

A portion of the thick metal layer 418 is then etched away using a known method such that two separate metal electrodes are defined as shown in FIG. 4f. An n-electrode 422 is formed, contacting the n-pad and providing an electrical path to the n-type layer 404. Similarly, a p-electrode 424 contacts the p-pad and provides an electrical path to the p-type layer 406. The electrodes 422, 424 should be electrically isolated from one another and from the active region 408. In this particular embodiment isolation is achieved with the spacer elements 416 as discussed above. The bottom surfaces of the electrodes 422, 424 function as leads and are easily accessible from the bottom of the device 400.

In other embodiments, different process steps may be used to achieve a device configuration similar to that shown in FIG. 4f. For example, noncontiguous p-electrode and n-electrodes may be formed in a single deposition step by using known methods such as thick patterned photoresist. Different embodiments of the devices can have electrodes arranged in different ways according to the present invention. For the device 400, the electrodes 422, 424 are shown extending to the same level at the bottom of the device, which facilitates mounting the device to structure, such as a submount or printed circuit board (PCB), where the mounting points are at the same level. In other embodiments, the electrodes can extend to different levels so that the device can be mounted to a structure having mounting points at different levels. In one such embodiment, the p-type electrode 424 can extend further from the device 400 than the n-type electrode such that their leads are at different levels.

Figure 4G:
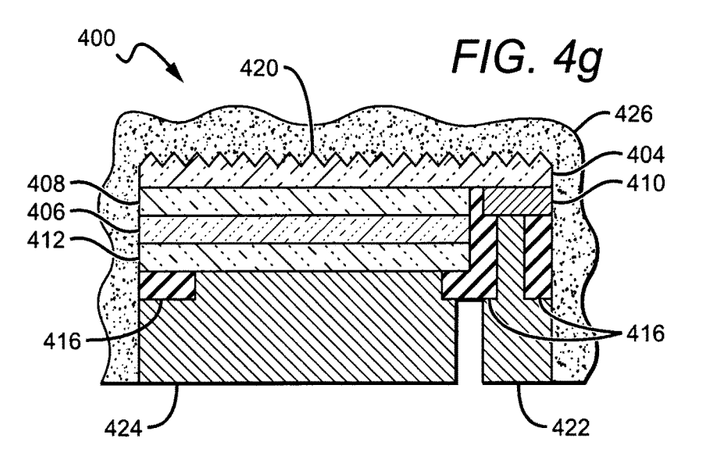

In FIG. 4g, a phosphor layer 426 can be formed on the top surface of the n-type layer 404. The phosphor layer 426 may also cover other surfaces such as the sides of the device. Phosphor layers are known in the art as a wavelength conversion mechanism and may be deposited using known methods. The phosphor layer 426 may comprise more than one phosphor as well as light scattering particles. By down-converting a portion of the light emitted from the active region 408, the device emission spectrum can be shifted to yield a color of light that is different from that which is emitted internally from the active region 408. A binder (not shown), for example silicone, may be used to bind the phosphor layer 426 to the n-type layer 404. The phosphor layer 426 may be provided in a number of known binders such as, for example, epoxy, silicone or low-temperature glass. The phosphor layer 426 may be formed by, for example, dispensing, screen printing, jet printing, molding, spin coating or by mounting a previously made component.

The new arrangement, one embodiment of which is shown in FIGS. 4a-4g, provides a semiconductor device that has two bottom-side contacts for biasing the light-emitting semiconductor layers. Thus, the device does not require a wire bond or other such connection means. The new arrangement allows for a phosphor layer, an encapsulant, and other elements or features that are typically added at the packaging level to be added at the wafer level of fabrication.

Figure 5:
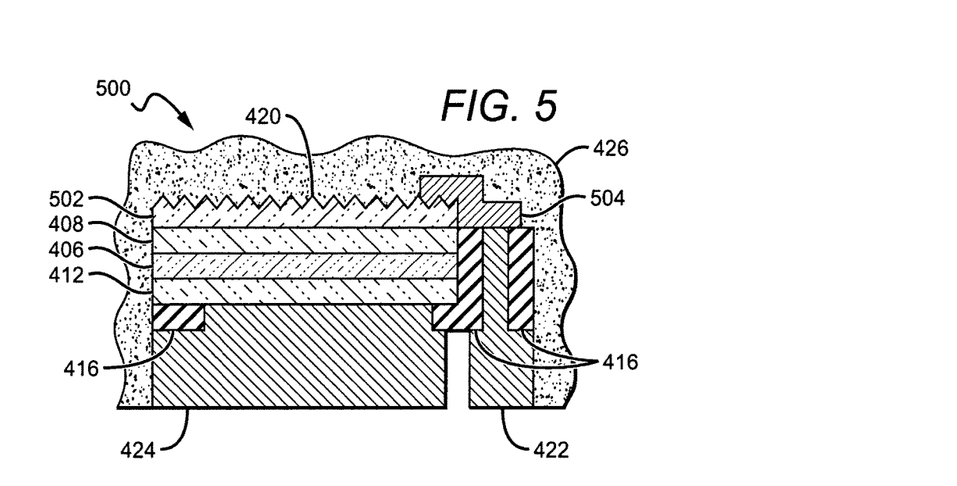
FIG. 5 is a cross-sectional view of another embodiment of a semiconductor device according to the claims of the present invention.

FIG. 5 depicts another embodiment of a semiconductor device 500 according to the claims of the present invention. The device 500 and the device 400 shown in FIG. 4g function similarly and contain several common elements that are denoted by using the same reference numbers. The n-type layer 502 of device 500 is disposed over the active region 408 such that the edges of all the semiconductor layers 502, 406, 408 are substantially flush with each other. In this embodiment the n-type layer 502 has been removed from the area above the n-electrode 422 using a known process such as etching. A lateral connection is established using a stairstep-shaped n-pad 504 that is deposited using a known method. Because all of the semiconductor layers 502, 406, 408 are located entirely above the p-electrode 424, the configuration may exhibit increased structural stability.

In another embodiment, the n-electrode 422 and the spacer elements 416 that are shown on the right side of FIG. 5 may extend up to a point such that their top surfaces are flush with the top surface of the n-type layer 502. In this case, the n-pad would be flat and extend across the flush top surfaces forming a connection between the n-electrode 422 and the n-type layer 502.

Figure 6:
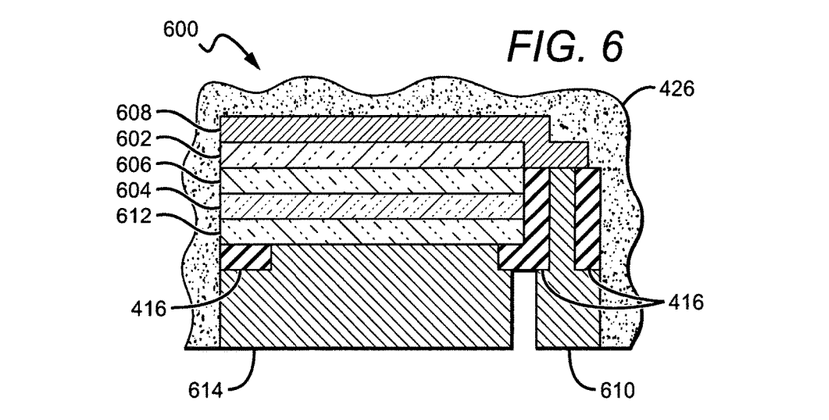
FIG. 6 is a cross-sectional view of another embodiment of a semiconductor device according to the claims of the present invention.

Although the embodiment shown in FIG. 5 features an n-type layer 502 which is disposed on the top side of the active region 408, it may be desirable to switch the orientation of the layers. In FIG. 6 the p-type layer 602 is on the top side of the active region 606 with the n-type layer 604 disposed on the bottom side of the active region 606. The device 600 contains many common elements and functions similarly as the embodiment shown in FIG. 4g. In this configuration, a thin semi-transparent stairstep-shaped p-pad might be particularly advantageous. Current does not spread as well throughout p-type layers as it does throughout n-type layers. For this reason, thin semi-transparent current spreading layers are often used to help disperse the current more evenly across the surface of a p-type layer. The stairstep-shaped p-pad 608 forms a good ohmic contact with substantially the entire top surface of the p-type layer 606. Thus, the stairstep-shaped p-pad 608 provides a connection between the p-electrode 610 and p-type layer 602 while effectively spreading current across the length of the p-type layer 602 and while allowing light to be emitted out of the top surface of the device 600. The n-pad 612 is a reflective element and provides a connection between the n-electrode 614 and the n-type layer 604. Both electrodes 610, 614 have leads with access points on the bottom surface of the device 600.

Figure 7:
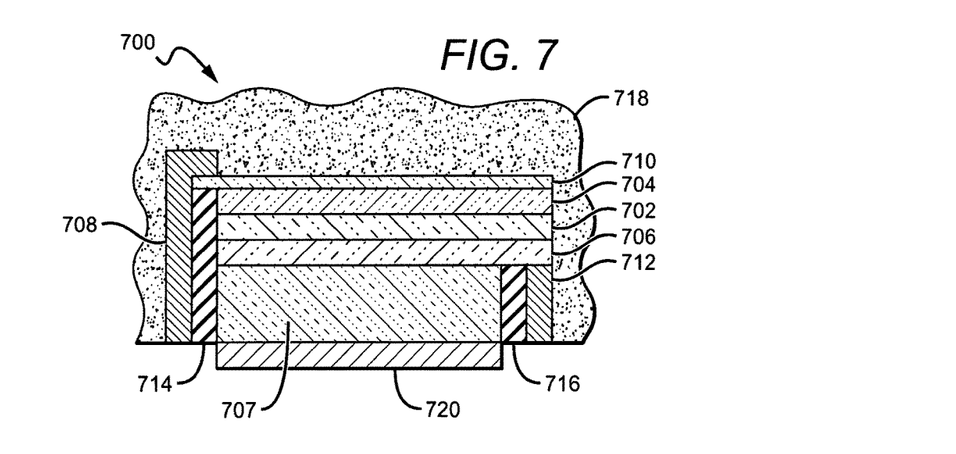
FIG. 7 is a cross-sectional view of another embodiment of a semiconductor device according to the claims of the present invention.

FIG. 7 shows another embodiment of a semiconductor device 700 according to the claims of the present invention. An active region 702 is interposed between a p-type layer 704 and an n-type layer 706. The semiconductor layers 702, 704, 706 are formed on a substrate 707 made from a material such as SiC. In this embodiment at least part of the growth substrate 707 remains as part of the device 700, adding structural stability. A p-electrode 708 is disposed along at least one of the outside edges of the device 700. A current spreading layer 710 is formed on top of the p-type layer 704. The current spreading layer 710 should be in good ohmic contact with the p-type layer 704 to ensure that current is distributed over substantially the entire surface of the p-type layer 704 so that light is emitted out of the top surface of the device 700. The current spreading layer 710 may comprise transparent conductive oxides, such as indium tin oxide (ITO), for example. As shown, the p-electrode 708 makes contact with the current spreading layer 710 along its top lateral surface. An n-electrode 712 is arranged along one of the outside edges of the device 700 opposite the p-electrode 708. The n-electrode 712 contacts the n-type layer 706 on its bottom surface. Both electrodes 708, 712 have leads that are accessible from the bottom side of the device 700. Spacer element 714 isolates p-electrode 708 from the n-type layer 706 and the substrate 707. Spacer element 716 isolates n-electrode 712 from the substrate 707. The spacer elements 714, 716 may comprise a high resistance or insulating dielectric material such as $SiO_2$ or silicon nitride, for example.

A phosphor layer 718 can be formed on the top surface of the current spreading layer 710. The phosphor layer may cover other surfaces as well, such as the side surfaces of the device 700. As discussed above, the phosphor layer 718 performs a wavelength conversion function and may be provided in a number of known binders such as, for example, epoxy, silicone or low-temperature glass. The phosphor layer 718 may be formed by, for example, dispensing, screen printing, jet printing, molding, spin coating, or by mounting a previously made component.

A reflective layer 720 may be added to the device 700 to improve the external quantum efficiency. In the embodiment shown in FIG. 7, the reflective layer 720 is disposed on the bottom side of the substrate 707. Light emitted from the active region 702 is redirected by the reflective layer 720 towards the primary emission surface at the top of the device 700. The reflective layer 720 should comprise a material with high reflectivity such as aluminum, for example. Although it is shown on the bottom surface of the substrate 707, the reflective layer 720 may also be disposed internally within the device 700.

In other embodiments, the substrate 707 may comprise a conductive material such as n-type SiC, allowing for an electrical connection to the bottom semiconductor layer and obviating the need for the n-electrode. In this case, n-electrode 712 and spacer element 716 would be unnecessary and reflective layer 720 and substrate 707 would extend such that their right edge would be flush with or even beyond the right edges of the semiconductor layers 702, 704, 706. The electrical connection to the n-type layer 706 would run from the bottom surface of the device 700 up through the conductive substrate and reflective layer up to the layer 706.

Figure 8:
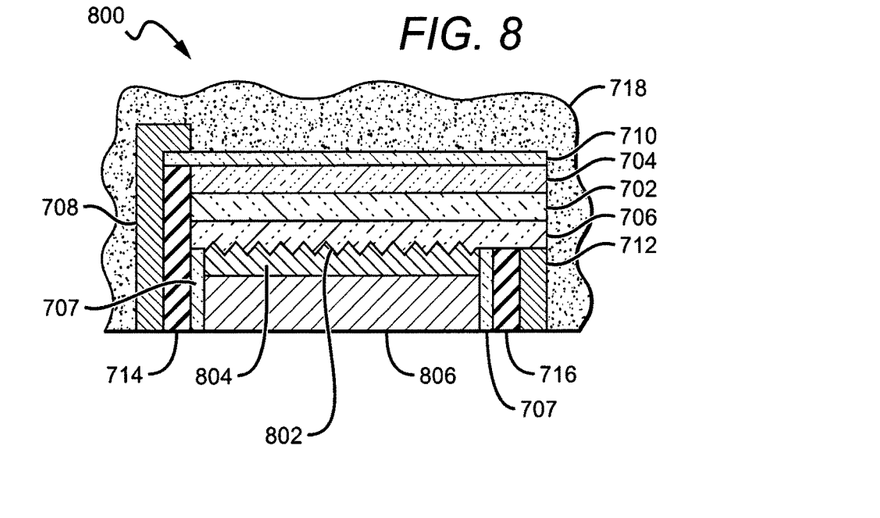
FIG. 8 is a cross-sectional view of another embodiment of a semiconductor device according to the claims of the present invention.

FIG. 8 illustrates another embodiment of a semiconductor device 800 according to the claims in the present invention. The device 800 shares several common elements with and functions similarly as device 700 shown in FIG. 7. In this embodiment, a portion of the substrate 707 has been removed using a known process, exposing some of the surface of the n-type layer 706. Part of the substrate 707 may remain for structural support as shown; however, in other embodiments all of the substrate 707 may be removed. The exposed n-type layer 706 may be modified as discussed in detail above. The modified surface 802 combats TIR by scattering the light, improving the light extraction. A reflective layer 804 is formed on the bottom surface of the n-type layer 706. A preferred material for the reflective layer 804 is aluminum, but other materials may be used.

The opening created by the removal of the substrate 707 can be filled to create a base element 806 comprising a material such as polyimide, for example. Base element 806 adds structural support to the device 800. In other embodiments, the base element may comprise a conductive material such as aluminum or copper, for example, allowing for an electrical connection to the bottom semiconductor layer and obviating the need for the n-electrode. In this case, n-electrode 712 and spacer element 716 would be unnecessary and reflective layer 804 and base element 806 would extend such that their right edge would be flush with or even beyond the right edges of the semiconductor layers 702, 704, 706. The electrical connection to the n-type layer 706 would run from the bottom surface of the device 700 up through the conductive base element and reflective layer up to the layer 706.

Figure 9:
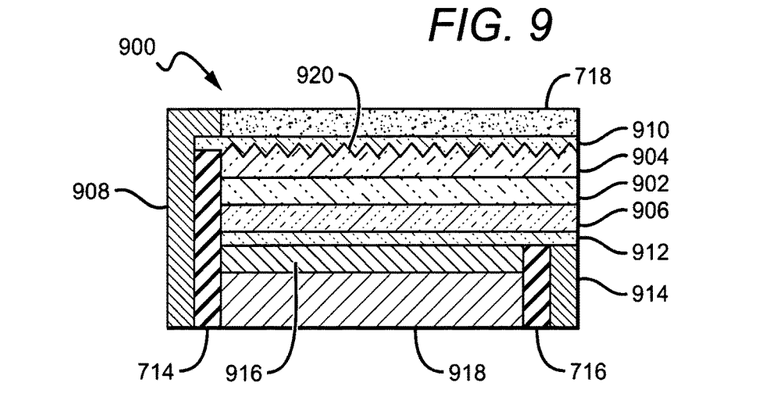
FIG. 9 is a cross-sectional view of another embodiment of a semiconductor device according to the claims of the present invention.

Another embodiment of a semiconductor device 900 according to the claims of the present invention is shown in FIG. 9. The device 900 shares common elements with and functions similarly as the device 700. The device 900 can be fabricated using a flip-chip process that is known in the art. Thus, the active region 902 is interposed between n-type layer 904 and p-type layer 906, where the n-type layer is arranged on the top side of the active region with respect to the orientation shown in FIG. 9.

The n-electrode 908 is disposed using a known process vertically along the outer edge of the device 900, providing an electrical connection from a lead accessible from the bottom surface of the device 900 to the n-type layer 904. In this embodiment a current spreading layer 910 is shown on the top surface of the n-type layer 904. However, in another embodiment the current spreading layer 910 may be disposed on only a portion of the n-type layer or even omitted as current typically spreads very well through n-type materials. A thin semi-transparent current spreading layer 912 is disposed on the p-type layer 906. A p-electrode 914 extends vertically down from the current spreading layer 912 along the outside of the device 900 such that a lead is accessible from the bottom side of the device 900. As discussed above, because the leads of the electrodes 908, 914 are accessible from the bottom side of the device 900, there is no need for a wire bond to connect the device 900 to an external voltage source.

A reflective layer 916 is disposed on the bottom surface of the current spreading layer 912. The reflective layer 916 may comprise a material that is both reflective and conductive such as mixture of platinum and silver, for example. In another embodiment, the reflective layer may comprise a multilayer stack of dielectric materials such as $SiO_2/Ta_2O_5$, for example, that comprise a distributed Bragg reflector. A base element 918 that provides structural support is formed below the reflective layer 916. The base element 918 may comprise a thermally conductive material such as copper, for example, and is disposed on the bottom of the reflective layer 916 between the spacer elements 714, 716. The modified surface 920 of the n-type layer 904 enhances the light extraction of the device 900 as discussed above. A phosphor layer 718 is disposed over the current spreading layer 910. The phosphor layer 718 covers all or part of the spreading layer 910. The phosphor layer 718 may also cover the entire top side of the device as well as the sides of the device as shown in FIG. 7.

Figure 10:
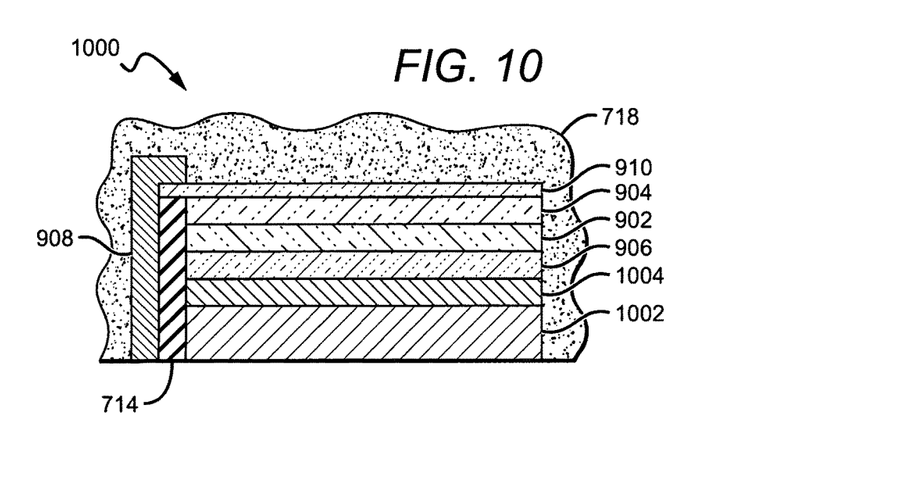
FIG. 10 is a cross-sectional view of another embodiment of a semiconductor device according to the claims of the present invention.

FIG. 10 illustrates another embodiment of a semiconductor device 1000. The device 1000 shares several common elements with device 900 and functions in a similar fashion. In this embodiment, the conductive base element 1002 functions as a p-electrode. A reflective layer 1004 is disposed on the bottom surface of the p-type layer to make an ohmic contact to the p-type layer and to redirect light emitted from the active region 902 towards the primary emission surface of the device 1000. If both the base element 1002 and the reflective layer 1004 are conductive materials, there is no need for a current spreading layer or a separate electrode to contact the p-type layer 906. The electrical connection may be made from the bottom side of the device anywhere along the exposed surface of the conductive base element 1002. The conductive base element 1002 may comprise a metal such as copper, nickel or gold, for example, or a doped semiconductor such as SiC or Si, for example.

Figure 11:
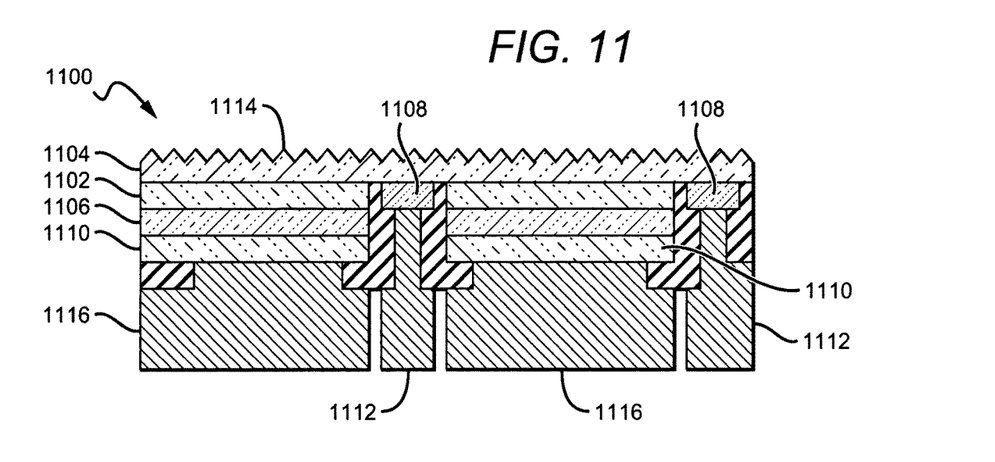
FIG. 11 is a cross-sectional view of another embodiment of a semiconductor device according to the claims of the present invention.

FIG. 11 shows an embodiment of a semiconductor device 1100. The device 1100 functions similarly as the device 400 as shown in FIG. 4g and shares many common elements. The device 1100 has the added advantage of scalability in two dimensions. An active region 1102 is interposed between an n-type layer 1104 and a p-type layer 1106. The n-type layer 1104 is contacted in several locations by multiple n-pads 1108. Likewise, the p-type layer 1106 is contacted in several locations by multiple p-pads 1110. Multiple n-electrodes 1112 having leads accessible from a surface of the device 1100 opposite the primary emission surface 1114 provide multiple electrical paths to the n-type layer 1104 through the n-pads 1108. Multiple p-electrodes 1116, also opposite the primary emission surface 1114, provide electrical paths to the p-type layer 1106. Because the growth substrate has been removed, the electrodes 1112, 1116 must be thick enough to provide primary mechanical support for the device.

Because current spreads better through n-type semiconductor, materials, the n-pads 1108 can be much smaller than the p-pads 1110 as shown in FIG. 11. In one embodiment, vias can be used to expose the n-type layer. The vias can be formed by etching or other means through the p-type layer 1106 and the active region 1102 to expose the n-type layer 1104. The n-pads 1108 and p-pads 1110 can then be deposited, followed by the n-electrodes 1112 and p-electrodes 1116 using processes similar to those discussed above relating to FIGS. 4a-4g. A surface of the n-type layer 1104 may be modified as shown to improve light extraction. Also, a phosphor layer (not shown) may be deposited over all the surfaces of the device 1100 or only the top primary emission surface of the device 1100.

The embodiment shown in FIG. 11 allows for scalability by providing for good current spreading across substantially all of the n-type and p-type layers 1104, 1106 regardless of the size of the device.

Figure 12A:
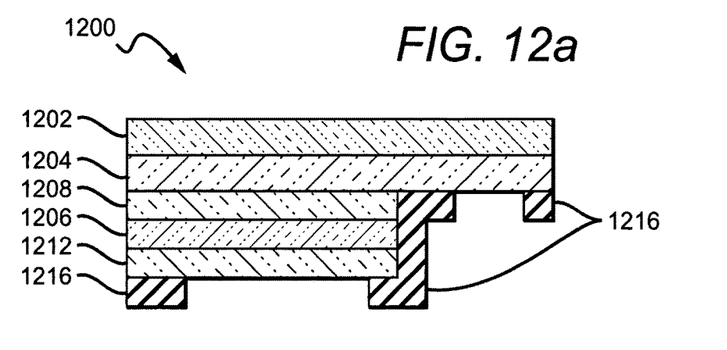
FIGS. 12a-12c are cross-sectional views of one embodiment of a semiconductor device according to the claims of the present invention shown at various stages of production.
Figure 12B:
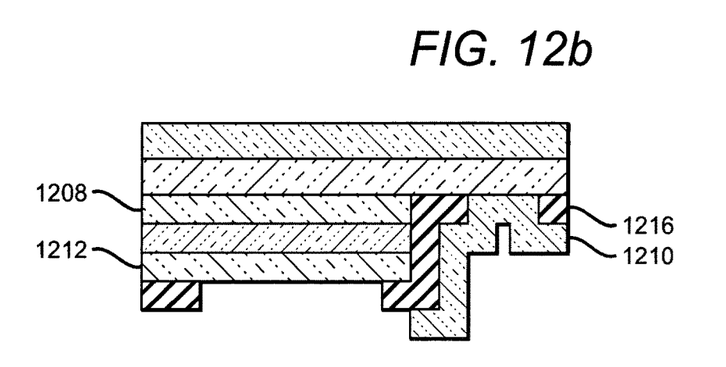
Figure 12C:
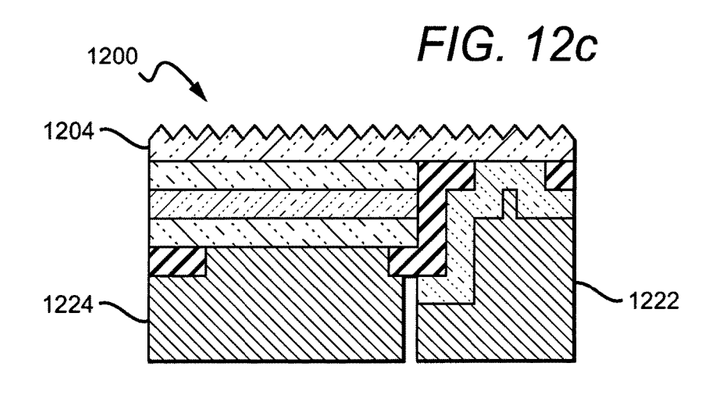

FIGS. 12a-c illustrate an embodiment of a semiconductor device 1200 in various steps of production. The device 1200 is similar to device 400 shown in FIG. 4g and shares many common elements. An n-type layer 1204 and p-type layer 1206 are grown on a substrate 1202. Referring to FIG. 12a, after etching to expose the n-type layer 1204, the p-pad 1212 is deposited. A spacer layer 1216 is then deposited and patterned by etching or other means to expose portions of the p-pad 1212 and the n-type layer 1204.

In FIG. 12b, an n-pad 1210 is deposited over the spacer layer 1216. The n-pad 1210 partially overlaps the p-pad 1212, although they are electrically isolated from one another by the spacer layer 1216 as shown. The overlapping n-pad 1210 provides a larger surface area for connection, allowing for a larger n-electrode 1210. The large n-electrode 1210 provides for an easier connection when packaging the device 1200 without sacrificing the size of the active layer 1208.

In FIG. 12c, the n- and p-electrodes 1222, 1224 are formed similarly as discussed above. The growth substrate 1202 is removed, and the surface of the n-type layer 1204 can be modified as shown. Additionally, a phosphor layer (not shown) can be deposited over all the surfaces of the device 1200 or only over the top primary emission surface.

Figure 13:
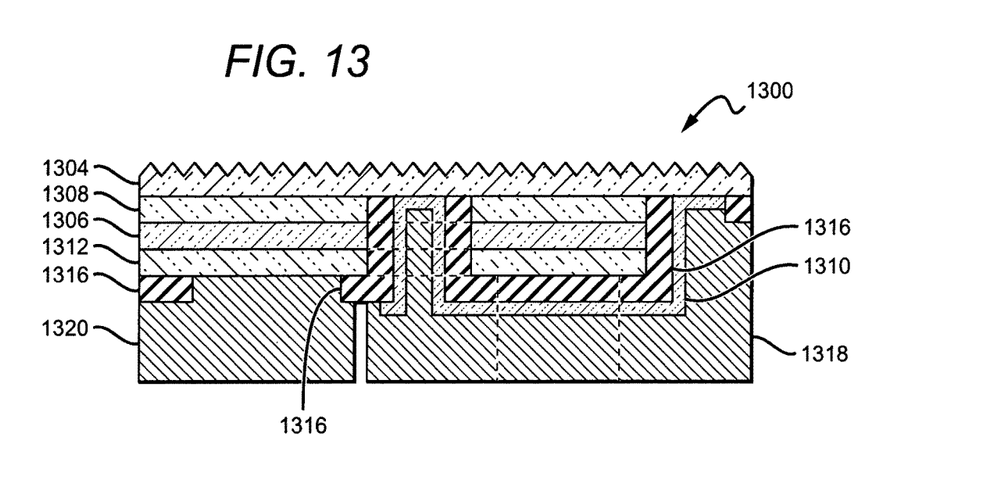
FIG. 13 is a cross-sectional view of another embodiment of a semiconductor device according to the claims of the present invention.

FIG. 13 shows an embodiment of a semiconductor device 1300. The device 1300 combines some of the features from the embodiments shown in FIG. 11 and FIG. 12. The device 1300 is scalable similar to the device 1100 shown in FIG. 11. An n-type layer 1304, an active region 1306, and a p-type layer 1306 are all grown on a growth substrate that is subsequently removed. Portions of the p-type layer 1306 and the active region 1308 are removed by etching or another process to reveal portions of the n-type layer 1304. The removed portions define multiple vias through which a connection to the n-type layer 1304 can be made.

The p-pad 1312 is then deposited with holes that correspond to the vias, allowing access to the n-type layer 1304. A spacer layer 1316 is then deposited and patterned to expose the p-pad 1312 in some regions and the n-type layer 1304 inside the vias. An n-pad 1310 is then deposited, contacting the n-type layer 1304 in the vias. The n-pad 1310 contacts the n-type layer 1304 in multiple locations and is interconnected throughout the device 1300. In order to provide the interconnectivity, part of the n-pad 1310 overlaps the p-pad 1312. The spacer layer 1316 keeps the n- and p-pads 1310, 1312 electrically isolated. The n- and p-electrodes 1318, 1320 are then formed and the growth substrate removed as discussed above. In another embodiment, the growth substrate may be removed earlier in the fabrication process.

The device 1300 allows for the size and geometry of the electrodes 1318, 1320 to be tailored independently of the n-pad 1310 and the vias through the active layer 1308. This can potentially make packaging the device 1300 simpler and more cost effective. Furthermore, because of the interconnected n-pad 1310 and the large p-pad 1312, current spreading in the semiconductor layers is improved which leads to increased light extraction over the entire active region 1308.

Although the present invention has been described in detail with reference to certain preferred configurations thereof, other versions are possible. Therefore, the spirit and scope of the invention should not be limited to the versions described above.

We claim:
1. A semiconductor device comprising:
an n-type epitaxial semiconductor layer comprising a first surface and a second surface opposite the first surface;
a p-type epitaxial semiconductor layer comprising a third surface and a fourth surface opposite the third surface;
an active region between the second surface and the fourth surface;
a wavelength conversion layer adjacent to at least a portion of the first surface of said n-type semiconductor layer, wherein the first surface is opposite the third surface of the p-type semiconductor layer;
a p-electrode comprising a lead that is accessible on the third surface, the third surface being opposite of a primary emission surface of said semiconductor device, said p-electrode electrically connected to said p-type layer;
an n-electrode comprising a lead that is accessible on the second surface, the second surface being opposite of said primary emission surface, said n-electrode electrically connected to said n-type layer; and
at least one spacer element, coupled to the n-electrode and the p-electrode, such that the at least one spacer element electrically isolates the n-electrode from the p-electrode, in which the n-electrode and the p-electrode extend laterally over the at least one spacer element,
wherein said first surface of said n-type epitaxial semiconductor layer is modified to enhance emission from said semiconductor device.
2. The semiconductor device of claim 1, further comprising:
an n-pad contacting said n-type layer and providing an electrical connection between said n-type layer and said n-electrode; and
a p-pad contacting said p-type layer and providing an electrical connection between said p-type layer and said p-electrode.
3. The semiconductor device of claim 2, wherein said n-pad partially overlaps said p-pad, said n- and p-pads electrically isolated by a spacer element.
4. The semiconductor device of claim 2, wherein said p-pad partially overlaps said n-pad, said p- and n-pads electrically isolated by a spacer element.
5. The semiconductor device of claim 2, wherein said p-pad comprises a reflective material.
6. The semiconductor device of claim 1, said wavelength conversion layer comprising a phosphor layer opposite said leads of said n- and p-electrodes such that said phosphor layer comprises said primary emitting surface.
7. The semiconductor device of claim 6, wherein said phosphor layer is disposed on said p-type layer.
8. The semiconductor device of claim 7, further comprising a current spreading layer interposed between said phosphor layer and said p-type layer, said current spreading layer electrically connected to said p-electrode.
9. The semiconductor device of claim 1, in which the at least one spacer element electrically isolates both said n- and p-electrodes from said active region.
10. The semiconductor device of claim 9, wherein said at least one spacer element comprises a dielectric material.
11. The semiconductor device of claim 9, wherein said at least one spacer element comprises a polymer.
12. The semiconductor device of claim 1, wherein substantially all of said n-type layer, said active region and said p-type layer are above said p-electrode.
13. The semiconductor device of claim 1, wherein said n-type layer, said p-type layer and said active region comprise materials from the Group-III Nitrides.
14. The semiconductor device of claim 1, wherein the thickness of said p-electrode is at least 20 μm and the thickness of said n-electrode is at least 20 μm.
15. The semiconductor device of claim 1, wherein the thickness of said p-electrode is at least 50 μm and the thickness of said n-electrode is at least 50 μm.
16. The semiconductor device of claim 1, wherein substantially all of said n-type layer, said active region and said p-type layer are disposed between said n-electrode and said primary emission surface.
17. The semiconductor device of claim 1, wherein said wavelength conversion layer is adjacent to said n-type semiconductor layer.
18. A semiconductor chip device, comprising:
an n-type semiconductor layer comprising a primary emission surface;
a p-type semiconductor layer;
an active region between said n- and p-type layers;
an n-electrode integral to said semiconductor chip device and comprising a lead that is accessible on a surface opposite said primary emission surface, said n-electrode electrically coupled to said n-type semiconductor layer;
a p-electrode integral to said semiconductor chip device and comprising a lead that is accessible on a surface opposite said primary emission surface, said p-electrode electrically coupled to said p-type semiconductor layer;
at least one spacer element, coupled to the n-electrode and the p-electrode, such that the at least one spacer element electrically isolates the n-electrode from the p-electrode and further electrically isolates the n-pad and the p-pad from the active region, in which the n-electrode and the p-electrode extend laterally over the at least one spacer element; and a phosphor layer coupled to the primary emission surface, wherein said primary emission surface of said n-type semiconductor layer is modified.

19. The semiconductor device of claim 18, further comprising:
an n-pad contacting said n-type layer and providing an electrical connection between said n-type layer and said n-electrode; and
a p-pad contacting said p-type layer and providing an electrical connection between said p-type layer and said p-electrode.

20. The semiconductor device of claim 19, wherein said p-pad comprises a reflective material.

21. The semiconductor device of claim 18, wherein the phosphor layer is coupled to the wafer opposite said leads of said n- and p-electrodes.

22. The semiconductor device of claim 18, further comprising at least one spacer element configured to electrically isolate said n-electrode from said p-electrode and to electrically isolate both said n- and p-electrodes from said active region.

23. The semiconductor device of claim 18, wherein substantially all of said n-type layer, said active region and said p-type layer are above said p-electrode.

24. The semiconductor device of claim 18, wherein said n-type layer, said p-type layer and said active region comprise materials from the Group-III Nitrides.

25. The semiconductor device of claim 18, wherein the thickness of said p-electrode is at least 50 μm and said n-electrode is at least 50 μm.

26. A semiconductor Group-III nitride device, comprising:
a flip-chip light emitting diode (LED) structure comprising an active region between a first surface of an n-type layer and a p-type layer;
an n-pad electrically coupled to the first surface of said n-type layer;
a wavelength conversion layer, coupled to at least a second surface of the n-type layer;
a p-pad electrically coupled to said p-type layer opposite an emission surface of the wavelength conversion layer, the emission surface of the wavelength conversion layer being opposite the second surface of the n-type layer;
at least one spacer element, coupled to at least the p-pad, in which the at least one spacer element electrically isolates the n-pad from the p-pad and further electrically isolates the n-pad and the p-pad from the active region; and
an electrode layer, coupled to the p-pad and the at least one spacer element, the electrode layer patterned into at least one n-electrode and at least one p-electrode, in which patterning the electrode layer defines the at least one n-electrode and the at least one p-electrode and the defined at least one n-electrode and the defined at least one p-electrode are electrically isolated by the at least one spacer element;
wherein said at least one n-electrode and said at least one p-electrode are exposed on a side of said semiconductor device opposite said n-type layer such that said semiconductor device is mountable to a surface, and
wherein the second surface of said n-type layer is modified to enhance light emission from the emission surface of the semiconductor device.

27. A semiconductor device, comprising:
a light emitter structure comprising:
an n-type layer;
an active region coupled to a first surface of the n-type region;
a p-type layer coupled to the active region opposite the n-type layer,
a wavelength conversion layer coupled to a second surface of the n-type layer, wherein the second surface of said n-type layer is opposite said active layer and is modified to enhance light emission through the second surface of the n-type layer into the wavelength conversion layer;
an n-electrode electrically coupled to said n-type layer;
a p-electrode electrically coupled to said p-type layer; and
at least one spacer element, coupled to the n-electrode and the p-electrode, such that the at least one spacer element electrically isolates the n-electrode from the p-electrode and the n-electrode and the p-electrode extend laterally over the at least one spacer element.

28. A semiconductor device, comprising:
a flip-chip light emitting diode (LED) structure comprising an active region between an n-type layer and a p-type layer;
an n-electrode electrically coupled to said n-type layer;
a p-electrode electrically coupled to said p-type layer;
at least one spacer element, coupled to the n-electrode and the p-electrode such that the n-electrode and the p-electrode extend laterally over at least a portion of the at least one spacer element;
a wavelength conversion layer on said n-type layer and said p-type layer;
wherein said n-electrode and said p-electrode are exposed on a side of said semiconductor device opposite said n-type layer such that said semiconductor device is mountable to a surface wherein said n-electrode and said p-electrode are coplanar; and
wherein said n-type layer comprises a modified surface, said modified surface coupled to said wavelength conversion layer.

29. The semiconductor device of claim 28, further comprising a substrate on said n-type layer opposite said active region.

30. The semiconductor device of claim 29, wherein said substrate is shaped or textured to enhance light extraction.

* * * * *